(12) United States Patent
Tang et al.

(10) Patent No.: US 10,701,829 B2
(45) Date of Patent: Jun. 30, 2020

(54) SUPPORTING DEVICE AND SLIDE RAIL ASSEMBLY USING THE SAME

(71) Applicant: HONGFUJIN PRECISION ELECTRONICS (TIANJIN) CO., LTD., Tianjin (CN)

(72) Inventors: Chen-Sheng Tang, New Taipei (TW); Ting-Ya Liao, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 191 days.

(21) Appl. No.: 15/637,667

(22) Filed: Jun. 29, 2017

(65) Prior Publication Data

US 2018/0343764 A1   Nov. 29, 2018

(30) Foreign Application Priority Data

May 23, 2017   (CN) .......................... 2017 1 0368182

(51) Int. Cl.
| H05K 7/14 | (2006.01) |
| H01R 4/64 | (2006.01) |
| H05K 7/18 | (2006.01) |
| H01R 12/89 | (2011.01) |

(52) U.S. Cl.
CPC ........... *H05K 7/1489* (2013.01); *H01R 4/646* (2013.01); *H05K 7/1474* (2013.01); *H01R 12/89* (2013.01); *H05K 7/183* (2013.01)

(58) Field of Classification Search
CPC .... H05K 7/1447; H05K 7/1489; H05K 7/183; H01R 4/646; H01R 12/89
See application file for complete search history.

(56) References Cited

U.S. PATENT DOCUMENTS

| 1,301,495 | A | * | 4/1919 | Otte | ....................... | A47B 88/57 |
| | | | | | | 384/21 |
| 6,230,903 | B1 | * | 5/2001 | Abbott | ................. | H05K 7/1421 |
| | | | | | | 211/190 |
| 6,938,967 | B2 | * | 9/2005 | Dubon | ................. | H05K 7/1421 |
| | | | | | | 312/330.1 |
| 7,517,030 | B2 | * | 4/2009 | Cheng | .................. | H05K 7/1489 |
| | | | | | | 312/333 |
| 7,744,176 | B2 | * | 6/2010 | Milligan | ................ | A47B 88/49 |
| | | | | | | 312/334.32 |
| 8,104,851 | B2 | * | 1/2012 | Lu | ......................... | H05K 7/1489 |
| | | | | | | 312/334.5 |
| 8,226,181 | B2 | * | 7/2012 | Du | ........................ | H05K 7/1489 |
| | | | | | | 211/26 |
| 8,235,479 | B2 | * | 8/2012 | Yu | .......................... | A47B 88/49 |
| | | | | | | 312/334.16 |

(Continued)

*Primary Examiner* — Eret C McNichols
(74) *Attorney, Agent, or Firm* — ScienBiziP, P.C.

(57) ABSTRACT

A slide rail assembly includes a sliding rail and a supporting device. The supporting device includes a supporting bracket and a sliding bracket. The supporting bracket defines at least one sliding slot along an extending direction of the supporting bracket, and the sliding bracket defines at least one sliding portion corresponding to the at least one sliding slot. The sliding bracket is slidably connected to the supporting bracket through the at least one sliding portion and the at least one sliding slot, the sliding bracket is mounted to the sliding rail. The supporting device is also disclosed.

14 Claims, 5 Drawing Sheets

(56) References Cited

U.S. PATENT DOCUMENTS

| | | | | |
|---|---|---|---|---|
| 8,292,382 B2* | 10/2012 | Cheng | H05K 7/1489 | 312/334.4 |
| 8,721,012 B2* | 5/2014 | Chen | A47B 88/49 | 211/26 |
| 8,733,866 B2* | 5/2014 | Chen | A47B 88/40 | 312/334.4 |
| 8,967,744 B2* | 3/2015 | Chen | H05K 7/1489 | 312/334.4 |
| 9,328,769 B1* | 5/2016 | Chen | H05K 7/1489 | |
| 9,560,786 B2* | 1/2017 | Chen | A47B 96/067 | |
| 9,814,158 B1* | 11/2017 | Lin | H05K 7/1489 | |
| 10,104,800 B2* | 10/2018 | Sampath | H05K 7/1489 | |
| 10,149,538 B2* | 12/2018 | Chen | A47B 88/43 | |
| 10,209,002 B2* | 2/2019 | Hwang | A47B 88/473 | |
| 2005/0206284 A1* | 9/2005 | Dubon | H05K 7/1421 | 312/333 |
| 2006/0152115 A1* | 7/2006 | Dubon | H05K 7/1489 | 312/334.8 |
| 2008/0036347 A1* | 2/2008 | Liang | H05K 7/1489 | 312/334.5 |
| 2008/0073469 A1* | 3/2008 | Mushan | H05K 7/1489 | 248/205.1 |
| 2009/0267471 A1* | 10/2009 | Lu | H05K 7/1489 | 312/334.1 |
| 2011/0091141 A1* | 4/2011 | Liang | H05K 7/1489 | 384/20 |
| 2011/0100936 A1* | 5/2011 | Chang | H05K 7/1489 | 211/26 |
| 2011/0135224 A1* | 6/2011 | Chen | F16C 29/04 | 384/26 |
| 2012/0076445 A1* | 3/2012 | Zhang | A47B 88/483 | 384/20 |
| 2012/0087604 A1* | 4/2012 | Yu | H05K 7/1489 | 384/18 |
| 2012/0087605 A1* | 4/2012 | Chen | H05K 7/1489 | 384/42 |
| 2012/0141053 A1* | 6/2012 | Yu | H05K 7/1489 | 384/35 |
| 2012/0170878 A1* | 7/2012 | Yu | H05K 7/1489 | 384/35 |
| 2012/0257845 A1* | 10/2012 | Fan | H05K 7/1489 | 384/35 |
| 2013/0161468 A1* | 6/2013 | Chen | H05K 7/1489 | 248/298.1 |
| 2014/0265786 A1* | 9/2014 | Chen | H05K 7/1489 | 312/334.1 |
| 2015/0023619 A1* | 1/2015 | Yin | A47B 88/407 | 384/21 |
| 2015/0084494 A1* | 3/2015 | Tonthat | H05K 7/183 | 312/333 |
| 2015/0189989 A1* | 7/2015 | Chen | H05K 7/1489 | 248/201 |
| 2015/0216071 A1* | 7/2015 | Fan | H05K 7/1489 | 384/21 |
| 2016/0278234 A1* | 9/2016 | Chen | H05K 7/1489 | |
| 2016/0331136 A1* | 11/2016 | Chen | H05K 7/1489 | |
| 2016/0353601 A1* | 12/2016 | Sampath | H05K 7/1489 | |
| 2017/0000260 A1* | 1/2017 | Hashemi | F16O 29/048 | |
| 2017/0064859 A1* | 3/2017 | Chen | H05K 7/1488 | |
| 2017/0254586 A1* | 9/2017 | Hwang | A47B 88/473 | |
| 2017/0347480 A1* | 11/2017 | Bold | H05K 7/1489 | |
| 2018/0140093 A1* | 5/2018 | Chen | A47B 88/423 | |
| 2018/0168349 A1* | 6/2018 | Chen | H05K 7/1489 | |
| 2018/0199714 A1* | 7/2018 | Chen | A47B 88/75 | |
| 2018/0220797 A1* | 8/2018 | Chen | A47B 88/423 | |
| 2018/0310710 A1* | 11/2018 | Chen | A47B 88/423 | |
| 2018/0343764 A1* | 11/2018 | Tang | H05K 7/1489 | |
| 2018/0360213 A1* | 12/2018 | Chen | A47B 88/477 | |
| 2018/0368278 A1* | 12/2018 | Chen | F16C 29/002 | |
| 2019/0029419 A1* | 1/2019 | Chen | A47B 88/43 | |
| 2019/0053398 A1* | 2/2019 | Cayou | H05K 7/183 | |

\* cited by examiner

SUPPORTING DEVICE AND SLIDE RAIL ASSEMBLY USING THE SAME

FIELD

The subject matter herein generally relates to a supporting device and slide rail assemblies using the supporting device.

BACKGROUND

Generally, a slide rail assembly in a rack-based server system is mounted with a bracket at the front as well as at the rear, and is mounted to two posts of a rack via the two brackets. As the distance between the two posts may vary with system design or due to other factors, adjustable brackets are in demand.

BRIEF DESCRIPTION OF THE DRAWINGS

Implementations of the present technology will now be described, by way of example only, with reference to the attached figures.

DETAILED DESCRIPTION

Figure 1:
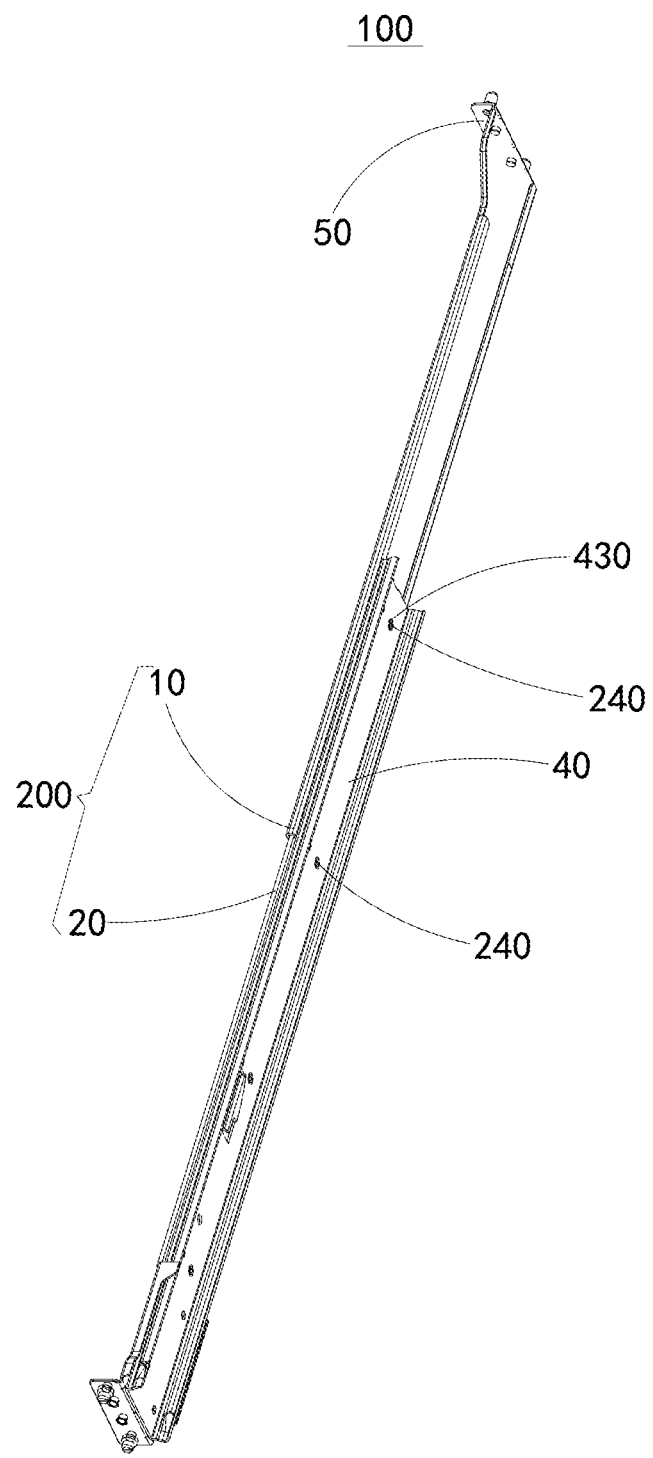
FIG. 1 is an isometric view of a first exemplary embodiment of a slide rail assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
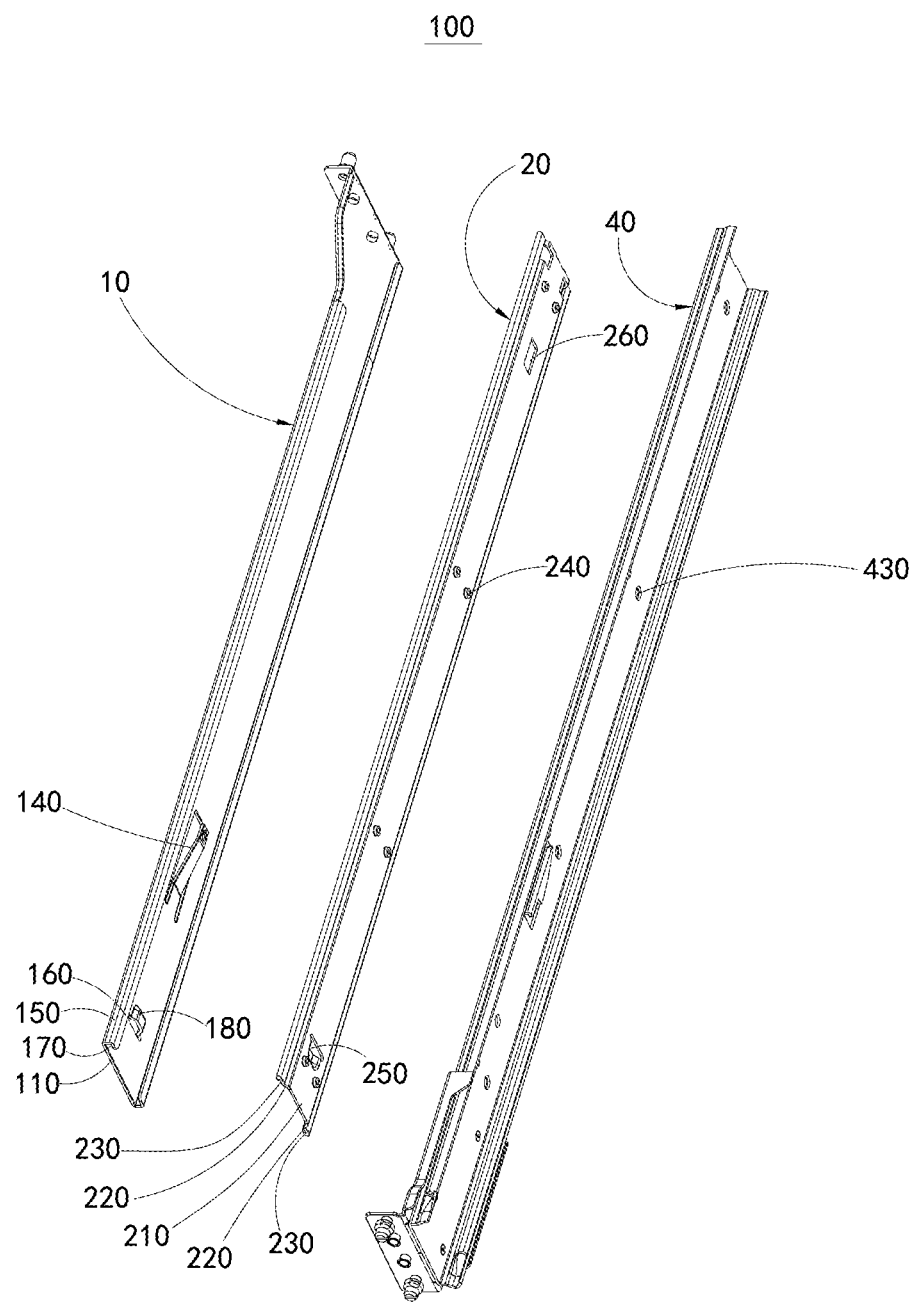
FIG. 2 is an exploded view of the slide rail assembly of FIG. 1.

A first exemplary embodiment is disclosed;

FIGS. 1 to 2 illustrate a slide rail assembly 100.

The slide rail assembly 100 can include a sliding rail 40 and a supporting device 200.

The supporting device 200 includes a supporting bracket 10 and a sliding bracket 20. The supporting bracket 10 defines two sliding slots 170 along an extending direction of the supporting bracket 10. The sliding bracket 20 defines two sliding portions corresponding to the two sliding slots 170.

The sliding bracket 20 is slidably connected to the supporting bracket 10 through the two sliding portions and the two sliding slots 170. The sliding bracket 20 is mounted to the sliding rail 40, so that the supporting bracket 10 can slide relative to the sliding rail 40 to adjust the effective length of the slide rail assembly 100.

The sliding bracket 20 can include a sliding plate 210, each of the two sliding portions can be a flange 230 connected to a side of the sliding plate 210. Correspondingly, the sliding bracket 20 further includes two first bending portions 220, each flange 230 is connected to a side of the sliding plate 210 through a corresponding first bending portion 220. The flange 230 can be parallel with the sliding plate 210.

In at least one exemplary embodiment, the sliding plate 210 defines a locking member 240, the sliding rail 40 defines a locking hole 430 corresponding to the locking member 240. The sliding bracket 20 is mounted to the sliding rail 40 through the locking member 240 and the locking hole 430.

In at least one exemplary embodiment, each of the supporting bracket 10 and the sliding bracket 20 includes a latching unit. When the supporting bracket 10 slides along the sliding bracket 20 to a predetermined position, the supporting bracket 10 is latched by the latching units.

For example, the latching unit can include a clamping member 140 defined on the supporting bracket 10 and a clamping groove 260 defined on an end of the sliding bracket 20. When the supporting bracket 10 slides along the sliding bracket 20 to a predetermined position protruding out of the sliding bracket 20, the clamping member 140 is clamped by the clamping groove 260, so as to limit the maximum extending length of the slide rail assembly 100.

The latching units can further include a first stopping member 180 and a second stopping member 250. The first stopping member 180 is defined on an end of the supporting bracket 10, the second stopping member 250 is defined on the other end of the sliding bracket 20. When the supporting bracket 10 slides along the sliding bracket 20 to a predetermined position aligning with the sliding bracket 20, the first stopping member 180 is stopped by the second stopping member 250, so as to limit the minimum effective length of the slide rail assembly 100.

Figure 3:
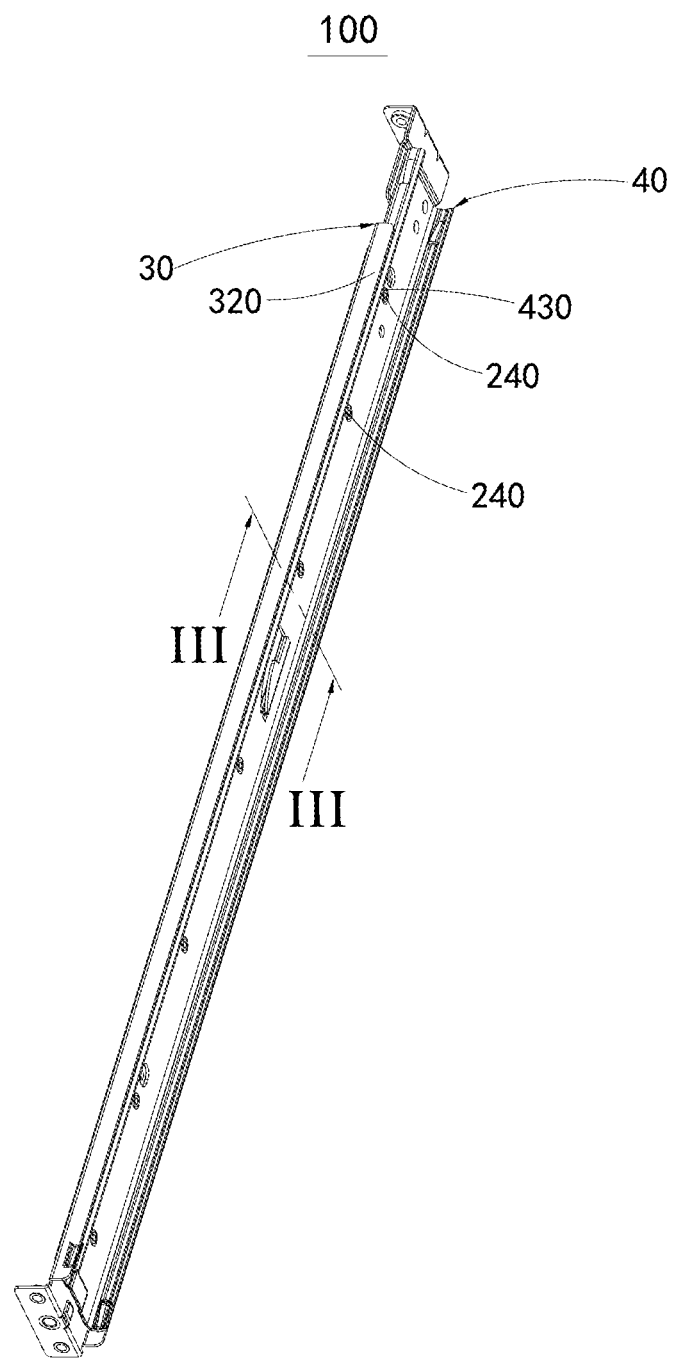
FIG. 3 is an isometric view of a second exemplary embodiment of a slide rail assembly.
Figure 4:
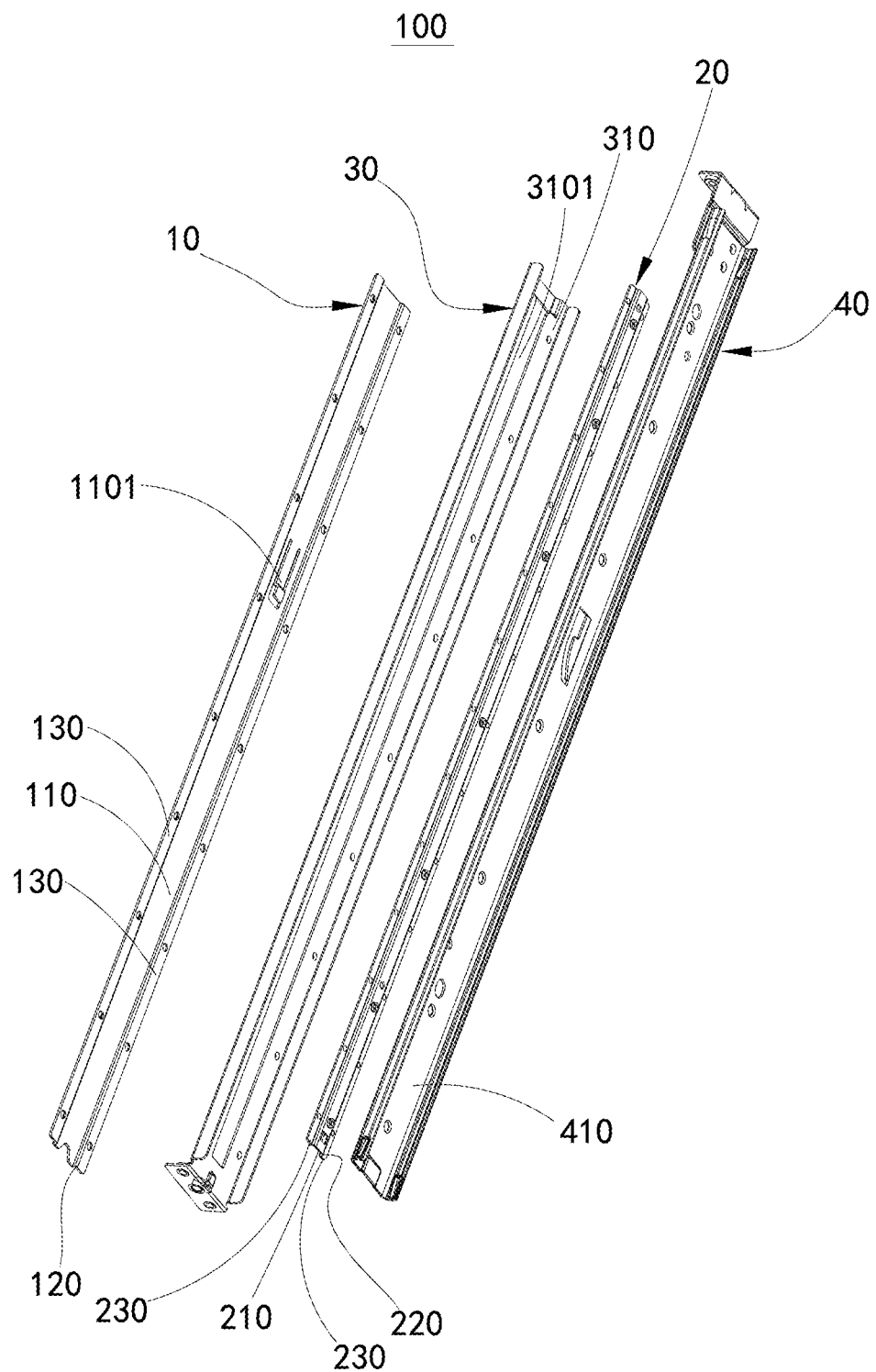
FIG. 4 is an exploded view of the slide rail assembly of FIG. 3.
Figure 5:
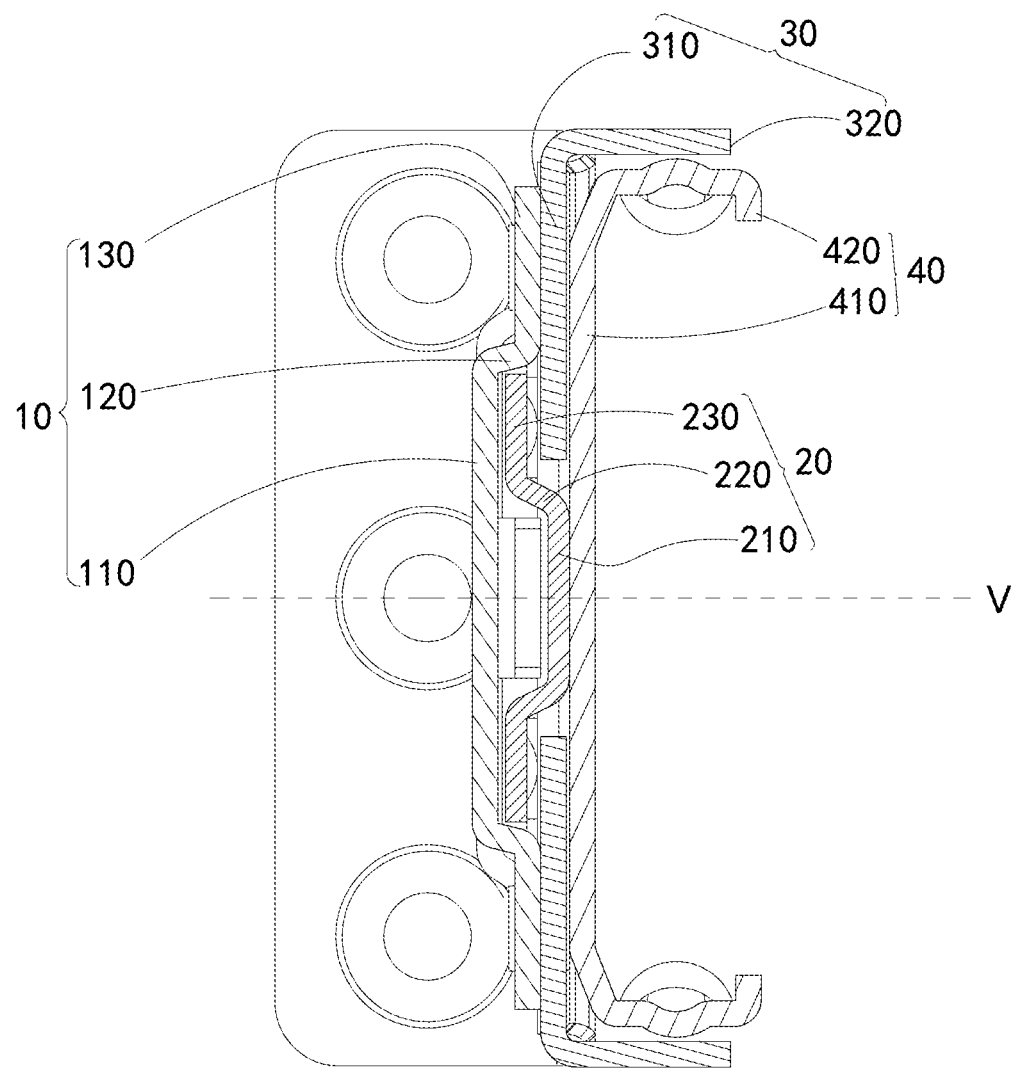
FIG. 5 is an sectional view of the slide rail assembly of FIG. 3, along line in FIG. 3.

A second exemplary embodiment is disclosed;

FIGS. 3 to 5 illustrate a slide rail assembly 100. The sliding bracket 20 and the sliding rail 40 in the second exemplary embodiment can be same as the sliding bracket 20 and the sliding rail 40 in the first exemplary embodiment.

The differences between the second exemplary embodiment and the first exemplary embodiment are as follows.

In the second exemplary embodiment, the supporting device 200 further includes a connecting bracket 30. The supporting bracket 10 includes a cover plate 110, two third bending portions 120, and two second folding edges 130. The two third bending portions 120 are connected to opposite sides of the cover plate 110, and the two second folding edges 130 are respectively connected to the two third bending portions 120. The two second folding edges 130 are parallel to the cover plate 110. The two bending portions 120 and the cover plate form a sliding slot (not labeled).

The connecting bracket 30 can include a supporting plate 310. The supporting plate 310 defines a guiding slot 3101 parallel with the sliding slot.

The supporting plate 310 is mounted to the two second folding edges 130. The two flanges 230 are slidably connected to the sliding slot. The sliding plate 210 is connected to the sliding rail 40 by passing through the guiding slot 3101.

In at least one exemplary embodiment, the connecting bracket 30 can further include two third folding edges 320, the two third folding edges 320 are respectively connected to two opposite sides of the supporting plate 310. The sidling rail 40 can include a rail body 410 and two fourth folding edges 420, the two fourth folding edges 420 are respectively connected to two opposite sides of the rail body 410. The two fourth folding edges 420 are parallel with the two third folding edges 320. A third folding edge 320 is slidably connected to an adjacent fourth folding edge 420.

Since the sliding rail 40, the sliding bracket 20, the connecting bracket 30, and the supporting bracket 10 of the slide rail assembly 100 are symmetric about the axis V shown in FIG. 5, each half and its labels mirror the other.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A supporting device comprising:
   a supporting bracket defining at least one first sliding slot along an extending direction of the supporting bracket; and
   a sliding bracket defining at least one sliding portion corresponding to the at least one first sliding slot;
   wherein the sliding bracket is slidably connected to the supporting bracket through the at least one sliding portion and the at least one first sliding slot; the sliding bracket comprises a sliding plate, the at least one sliding portion is a flange connected to a side of the sliding plate; the sliding bracket further comprises a first bending portion, the flange is connected to the side of the sliding plate through the first bending portion; the supporting device further comprises a connecting bracket; the supporting bracket comprises:
   a cover plate;
   two third bending portions connected to two opposite sides of the cover plate, wherein the two third bending portions and the cover plate form a second sliding slot; and
   two second folding edges respectively connected to the two third bending portions and parallel to the cover plate;
   wherein the connecting bracket comprises a supporting plate defining a guiding slot parallel with the second sliding slot, and the supporting plate is mounted to the two second folding edges, and the sliding plate is connected to a sliding rail by passing through the guiding slot; and
   wherein the connecting bracket comprises two third folding edges, the two third folding edges are respectively connected to two opposite sides of the supporting plate, the sliding rail comprises a rail body and two fourth folding edges, the two fourth folding edges are respectively connected to two opposite sides of the rail body, and the two fourth folding edges are parallel with the two third folding edges.

2. The supporting device of claim 1, wherein the sliding plate defines at least one locking member.

3. The supporting device of claim 1, wherein each of the supporting bracket and the sliding bracket comprises a latching unit corresponding to each other; and when the supporting bracket slides along the sliding bracket to a predetermined position, the supporting bracket is latched by the latching unit.

4. The supporting device of claim 3, wherein the latching unit comprises:
   a clamping member defined on the supporting bracket; and
   a clamping groove defined on an end of the sliding bracket;
   when the supporting bracket slides along the sliding bracket and to a predetermined position protruding out of the sliding bracket, the clamping member is clamped by the clamping groove.

5. The supporting device of claim 3, wherein the latching unit further comprises:
   a first stopping member defined on an end of the supporting bracket; and
   a second stopping member defined on the other end of the sliding bracket;
   when the supporting bracket slides along the sliding bracket and to a predetermined position aligning with the sliding bracket, the first stopping member is stopped by the second stopping member.

6. The supporting device of claim 1, wherein the supporting bracket comprises:
   a cover plate;
   two second bending portions connected to two opposite sides of the cover plate; and
   two first folding edges respectively connected to the two second bending portions;
   wherein each of the two second bending portions and corresponding one of the two first folding edges form a sliding slot; each of two opposite sides of the sliding plate defines a flange slidably connected to the sliding slot.

7. The supporting device of claim 1, wherein the flange is slidably connected to the second sliding slot.

8. A slide rail assembly comprising:
   a sliding rail; and
   a supporting device comprising:
   a supporting bracket defining at least one first sliding slot along an extending direction of the supporting bracket; and
   a sliding bracket defining at least one sliding portion corresponding to the at least one first sliding slot;
   wherein the sliding bracket is slidably connected to the supporting bracket through the at least one sliding portion and the at least one first sliding slot; the sliding bracket is mounted to the sliding rail; the sliding bracket comprises a sliding plate, the at least one sliding portion is a flange connected to a side of the sliding plate; the sliding bracket further comprises a first bending portion, the flange is connected to the side of the sliding plate through the first bending portion; the supporting device further comprises a connecting bracket; the supporting bracket comprises:

a cover plate;
two third bending portions connected to two opposite sides of the cover plate, wherein the two third bending portions and the cover plate form a second sliding slot; and
two second folding edges respectively connected to the two third bending portions and parallel to the cover plate;
wherein the connecting bracket comprises a supporting plate defining a guiding slot parallel with the second sliding slot, and the supporting plate is mounted to the two second folding edges, and the sliding plate is connected to the sliding rail by passing through the guiding slot; and
wherein the connecting bracket comprises two third folding edges, the two third folding edges are respectively connected to two opposite sides of the supporting plate, the sliding rail comprises a rail body and two fourth folding edges, the two fourth folding edges are respectively connected to two opposite sides of the rail body, and the two fourth folding edges are parallel with the two third folding edges.

9. The slide rail assembly of claim 8, wherein the sliding plate defines at least one locking member, the sliding rail defines at least one locking hole corresponding to the at least one locking member, the sliding bracket is mounted to the sliding rail through the at least one locking member and the at least one locking hole.

10. The slide rail assembly of claim 8, wherein each of the supporting bracket and the sliding bracket comprises a latching unit corresponding to each other;
and when the supporting bracket slides along the sliding bracket to a predetermined position, the supporting bracket is latched by the latching unit.

11. The slide rail assembly of claim 10, wherein the latching unit comprises:
a clamping member defined on the supporting bracket; and
a clamping groove defined on an end of the sliding bracket;
when the supporting bracket slides along the sliding bracket and to a predetermined position protruding out of the sliding bracket, the clamping member is clamped by the clamping groove.

12. The slide rail assembly of claim 10, wherein the latching unit further comprises:
a first stopping member defined on an end of the supporting bracket; and
a second stopping member defined on the other end of the sliding bracket;
when the supporting bracket slides along the sliding bracket and to a predetermined position aligning with the sliding bracket, the first stopping member is stopped by the second stopping member.

13. The slide rail assembly of claim 8, wherein the supporting bracket comprises:
a cover plate;
two second bending portions connected to two opposite sides of the cover plate; and
two first folding edges respectively connected to the two second bending portions;
wherein each of the two second bending portions and corresponding one of the two first folding edges form a sliding slot; each of two opposite sides of the sliding plate defines a flange slidably connected to the sliding slot.

14. The slide rail assembly of claim 8, wherein the flange is slidably connected to the second sliding slot; the sliding plate is connected to the sliding rail through the guiding slot.

* * * * *